(12) United States Patent
Kamins et al.

(10) Patent No.: US 7,378,347 B2
(45) Date of Patent: May 27, 2008

(54) METHOD OF FORMING CATALYST NANOPARTICLES FOR NANOWIRE GROWTH AND OTHER APPLICATIONS

(75) Inventors: Theodore I. Kamins, Palo Alto, CA (US); Philip J. Kuekes, Menlo Park, CA (US); Yong Chen, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 36 days.

(21) Appl. No.: 10/281,678

(22) Filed: Oct. 28, 2002

(65) Prior Publication Data

US 2004/0082178 A1   Apr. 29, 2004

(51) Int. Cl.
*H01L 21/461* (2006.01)

(52) U.S. Cl. ...................... 438/691; 438/694

(58) Field of Classification Search ........... 438/691, 438/700, 597, 689, 735, 737, 738, 618, 669, 438/795, 798, 694
See application file for complete search history.

(56) References Cited

U.S. PATENT DOCUMENTS

| | | | | |
|---|---|---|---|---|
| 5,772,905 | A * | 6/1998 | Chou | 216/44 |
| 6,190,929 | B1 * | 2/2001 | Wang et al. | 438/20 |
| 6,248,674 | B1 * | 6/2001 | Kamins et al. | 438/798 |
| 6,284,345 | B1 | 9/2001 | Ruoff | |
| 6,294,450 | B1 * | 9/2001 | Chen et al. | 438/597 |
| 6,309,580 | B1 | 10/2001 | Chou | |
| 6,365,059 | B1 | 4/2002 | Pechenik | |
| 6,407,443 | B2 | 6/2002 | Chen et al. | |
| 6,432,740 | B1 | 8/2002 | Chen | |
| 2001/0044200 | A1 | 11/2001 | Chen et al. | |
| 2002/0115002 | A1 | 8/2002 | Ballay et al. | |

OTHER PUBLICATIONS

Kamins, T.I. et al., Ti-Catalyzed Si Nanowires by Chemical Vapor Deposition: Microscopy and Growth Mechasi.
Gang Gu et al-Growth of Single-Walled Carbon Nanotubes From Microcontact-Printed Catalyst Patterns on Thin S13N4 Membranes—dvanced Functional Materials vol. 11 No. 4.
J Westwater et al-"Growth of Silicon Nanowires Via Au-Silane VLS Reaction"-Journal of Vacuum Science & Technology: Part B-American Institute of Physics vol. 15 No. 3-May, 1997.
Hannes Kind et al-"Patterned Films of Nanotubes Using Microcontact Printing of Catalysts"-Advances Materials vol. 11 No. 15 Oct. 20, 1999-pp. 1285-1289.
B. Michel et al-"Printing Meets Lithography: Soft Approaches to High-Resolution Patterning"-IBM Journal of Research & Development-vol 45 No. 5 Sep. 2001-pp. 697-719.

* cited by examiner

*Primary Examiner*—Wai-Sing Louie
*Assistant Examiner*—Dilinh Nguyen (57) ABSTRACT

Methods for forming a predetermined pattern of catalytic regions having nanoscale dimensions are provided for use in the growth of nanowires. The methods include one or more nanoimprinting steps to produce arrays of catalytic nanoislands or nanoscale regions of catalytic material circumscribed by noncatalytic material.

28 Claims, 6 Drawing Sheets

METHOD OF FORMING CATALYST NANOPARTICLES FOR NANOWIRE GROWTH AND OTHER APPLICATIONS

BACKGROUND

Growth of silicon nanowires offers the possibility of forming arrays with a large surface-to-volume ratio. These arrays can be used for chemical or environmental sensing, for electrical transduction, or for electron emission.

Bulk synthesis of semiconductor nanowires has been traditionally achieved using several variations of transition metal catalyzed techniques such as vapor-liquid-solid (VLS) synthesis. See, e.g., Kamins et al., J. Appl. Phys. 89:1008-1018 (2001) and U.S. Pat. No. 6,248,674. In standard vapor-liquid-solid (VLS) synthesis techniques used for producing silicon nanowires, each wire grows from a single particle of gold, cobalt, nickel or other metal. A vapor-phase silicon-containing species transported to the catalyst inside a high-temperature furnace condenses on the surface of the molten catalyst, where it crystallizes to form silicon nanowires.

Silicon nanowires produced by the standard VLS process are composed of a single crystal. In the standard process, the size of the catalytic particle controls the diameter of the nanowire grown from it. Thus, in order to obtain a uniform nanowire diameter distribution, monodispersed catalyst particles need to be created on a solid substrate. However, creation of nanometer size catalyst droplets is a non-trivial task. The nanoparticles can be formed by deposition techniques, such as chemical vapor deposition or physical vapor deposition. Although they can be registered to previously formed patterns, creating these pattern requires additional processing, usually involving costly lithography. In addition, conventional lithography processes cannot readily form nanoparticles of the desired small dimensions Thus, there is a need for improved methods of forming evenly spaced catalytic particles having dimensions in the nanometer range.

SUMMARY OF THE INVENTION

The present invention is directed to nanoimprinting or soft lithography methods for creating arrays of catalyst nanoparticles useful for forming nanoscale wires for device applications. The methods of the present invention are capable of forming smaller catalyst islands, more rapidly and less expensively than is possible with conventional lithography or even with electron-beam lithography.

In one embodiment, the method of forming an array of catalytic nanoparticles includes the steps of (1) providing a mold with nanoscale protrusions forming a desired pattern; (2) coating the protrusions with catalytic material; and (3) transferring the desired pattern of catalytic material to a substrate by contacting the substrate with the catalytic material.

In another embodiment, nanoscale regions of catalyst are localized within depressions of a non-catalytic layer by a method, which includes the steps of (1) depositing a layer of masking material on an underlying layer; (2) providing a mold with nanoscale protrusions forming a desired pattern; (3) pressing the protrusions of the mold into the masking material so that depressions are formed in the masking layer in the desired pattern; (4) exposing the underlying layer in the depressions; and (5) localizing catalytic material in the depressions. In a preferred embodiment, the underlying substrate itself is the source of the catalytic material localized in the depressions. Alternatively, the catalytic material is selectively deposited in the depressions.

Another embodiment is a method of forming nanoscale regions of exposed catalyst, comprising the steps of: (1) obtaining a substrate; (2) providing a catalytic layer on the substrate; (3) forming a non-catalytic layer over the catalytic layer; (4) depositing a layer of masking material on the non-catalytic layer; (5) providing a mold with nanoscale protrusions forming a desired pattern; (6) pressing the protrusions of the mold into the masking material so that depressions are formed in the masking layer in the desired pattern; (7) exposing regions of the non-catalytic layer in the depressions; (8) etching the exposed non-catalytic regions to expose regions of the catalytic layer; and (9) removing the masking material.

In a preferred embodiment a mold formed from parallel layers of nanoscale thickness, are used for the imprinting process. The mold can be made by: (1) providing a plurality of alternating layers of a first material and a second material forming a stack of parallel layers, wherein the first material is dissimilar from the second material, each layer having a nanoscale thickness; (2) cleaving and/or polishing the stack normal to its parallel layers, thereby creating an edge wherein each layer of the first and second materials is exposed; and (3) creating a mold having a pattern of alternating recessed and protruding lines by etching the edge of the stack in an etchant that attacks the first material at a different rate than the second material, thereby creating said pattern on the edge of the stack. The mold can then be used to create linear patterns of catalyst in further steps, which include: (1) providing a catalytic layer overlying a substrate and coating the catalytic layer with a masking material layer; and (2) forming a first set of nanoimprinted lines in the masking material layer, by pressing the protruding lines of the mold into the masking material layer exposing strips of the catalytic layer; and (3) etching the exposed strips of the catalytic layer to form lines of catalyst having a nanoscale width. Preferably, the method further comprises the steps of: (1) rotating the mold; and (2) applying the rotated mold to the masking material, thereby creating a second set of lines in the masking material, which intersect the first set of lines; and (3) etching the catalytic material that is not protected by the masking material. If the two sets of lines created by sequential application of the mold are orthogonal, a rectangular array of squares is created. Alternatively, the two sets of lines can be oriented at a non-perpendicular angle, thereby creating a skewed array of parallelograms.

Yet another embodiment of the present invention is a method for exposing nanoscale regions of catalytic material surrounded by a noncatalytic layer. Starting materials include a multilayered composite comprised of a substrate, a layer of catalytic material covering the substrate, and a masking layer formed over the catalytic layer. A first set of lines is imprinted in the masking layer using a mold having a patterned edge of alternating recessed and protruding nanoscale strips. The mold is then rotated and reapplied to form polygons of masking material in a regular array. The catalytic material that is not protected by the masking material is then covered with a non-catalytic material and the masking material is removed to expose nanoscale regions of the catalytic material circumscribed by non-catalytic material. The exposed regions of catalytic material can then be used as catalysts for nanowire growth.

BRIEF DESCRIPTION OF THE DRAWINGS

These and other features, aspects, and advantages of the present invention will become better understood with respect to the following description, appended claims, and accompanying drawings where:

DETAILED DESCRIPTION

In accordance with the present invention, methods are provided for creating arrays of catalytic material useful for forming nanowires for device applications. For controlled application of the nanowires, they should be regularly spaced or positioned on the substrate in a predetermined pattern. Growth of each nanowire generally proceeds from a catalyst nanoparticle on the substrate surface. As shown here, when the catalyzing nanoparticles do not have to be registered to underlying structure, they can be formed by "soft lithography," or nanoimprinting, which involves forming impressions of a mold, having nanoscale features, onto a layer of underlying material.

Figure 1A:
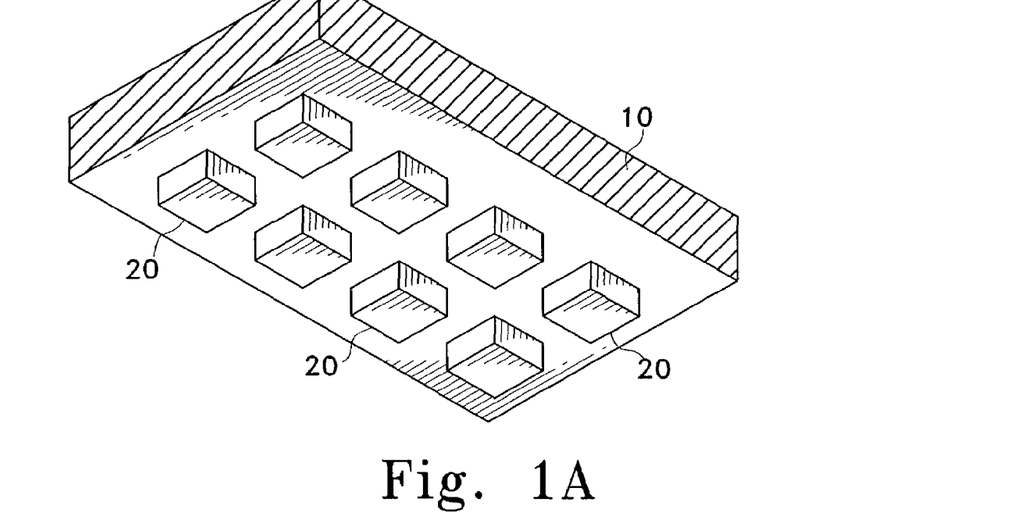
FIGS. 1A-1C shows steps for transferring a catalyst to a substrate using a mold in accordance with an embodiment of the present invention.
Figure 1B:
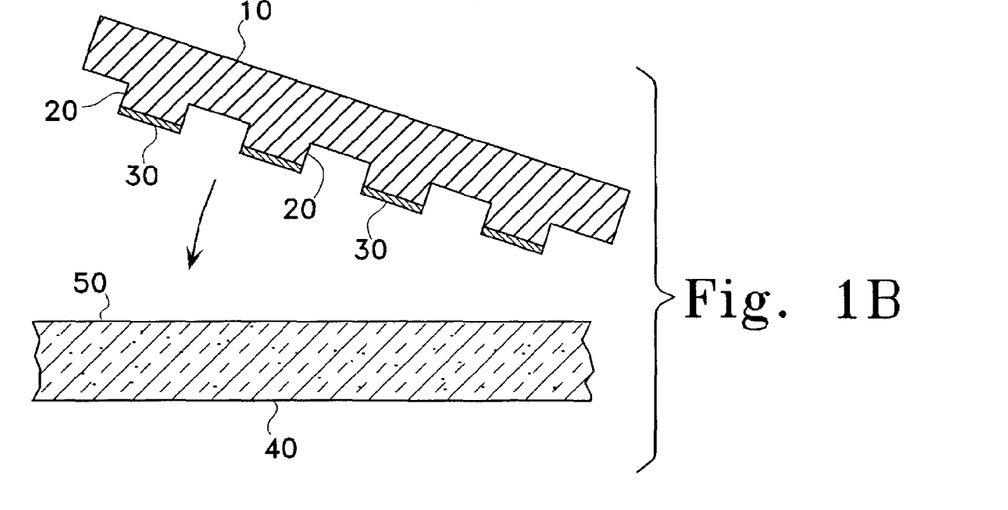
Figure 1C:
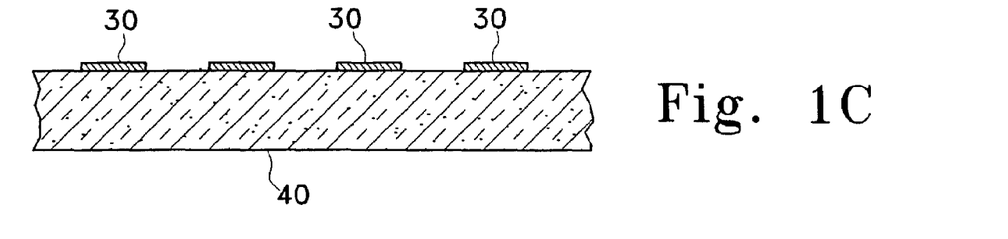

FIGS. 1A-1C shows steps for transferring a catalyst to a substrate using a mold in accordance with one version of the present invention. The mold typically contains an array of protruding and/or recessed regions having nanoscale dimensions. In FIG. 1A, a mold 10 is provided with nanoscale protrusions 20 forming all the individual elements of the desired pattern. A suitable mold for use in nanoimprint lithography is disclosed in U.S. Pat. Nos. 5,772,905 and 6,309,580 (incorporated herein by reference).

The mold 10 can be patterned with protruding features 20, such pillars, stripes, rectangular solids, or other three-dimensional designs. Protruding features having a minimum lateral size of 25 nm can be obtained using electron beam lithography, reactive ion etching (RIE) and other appropriate technology. Preferably, protruding features of the mold will have a lateral dimension of 5 nm to 20 nm. A mold 10 having the desired pattern of protruding nanoscale features at resolution levels much less than that of the-state-of-the-art e-beam lithography can be made according to methods described in further detail below, or as disclosed in the related application of Chen et. al. [HP Docket No. 100110197-1] (incorporated herein by reference). The typical depth of a protruding feature is from 5 nm to 500 nm, depending on the desired lateral dimension and the depth of the desired impression to be made.

In general, the mold 10 should be made of a relatively hard material capable of retaining its shape and integrity under the pressure applied during a nanoimprinting process. Accordingly, the mold can be made of materials such as metals, dielectrics, semiconductors, ceramics, or their combination.

As shown in FIGS. 1B and 1C, the protrusions 20 of mold 10 are coated with a material containing the desired catalyst, and the catalytic material 30 is then transferred to a substrate 40 having a non-catalytic surface 50 by physical contact, or possibly by an energetic or chemical attraction between the catalytic material and the surface of the substrate when they are brought close together.

In general, the catalytic material 30 includes a catalyst capable of catalyzing the growth of nanowires. Accordingly, the catalytic material can include metals used to generate silicon nanowires, such as titanium, gold, zinc, silver, copper, platinum, palladium, nickel, and manganese. Alternatively, the catalytic material can include a catalyst capable of catalyzing the growth of carbon nanotubes or metal nanowires.

In this version of the present invention, the substrate 40 can be any material having a noncatalytic surface 50 capable of accepting the catalytic nanoparticles transferred from the mold, e.g., a silicon, silicon dioxide, silicon nitride or alumina substrate.

Figure 2A:
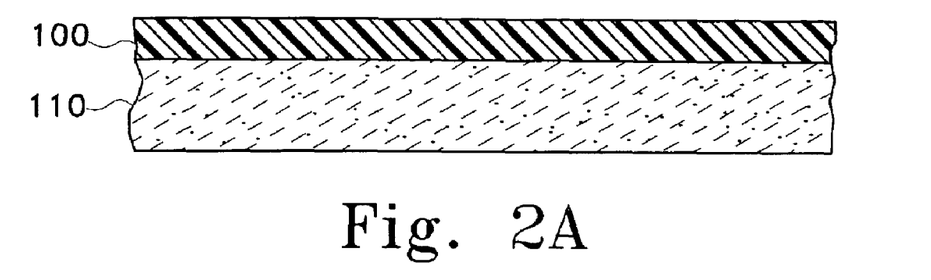
FIGS. 2A-2D show steps for imprinting a layer of masking material and exposing an underlying layer in accordance with an embodiment of the present invention.

FIGS. 2A-2D show steps for imprinting a layer of masking material and exposing an underlying layer in accordance with another version of the present invention. As shown in FIG. 2A, before imprinting, a thin masking layer 100 is deposited on top of an underlying layer 110. The masking layer 100 should be a relatively soft material capable of retaining an impression from the mold. For example, the masking layer may comprise a thermoplastic polymer deposited by an appropriate technique, such as spin casting. The underlying layer can be substrate, a non-catalytic layer, or a catalytic layer.

Figure 2B:
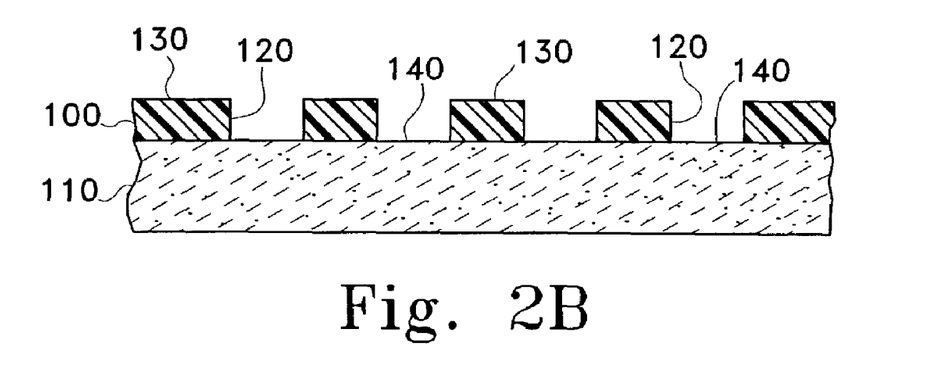
Figure 2C:
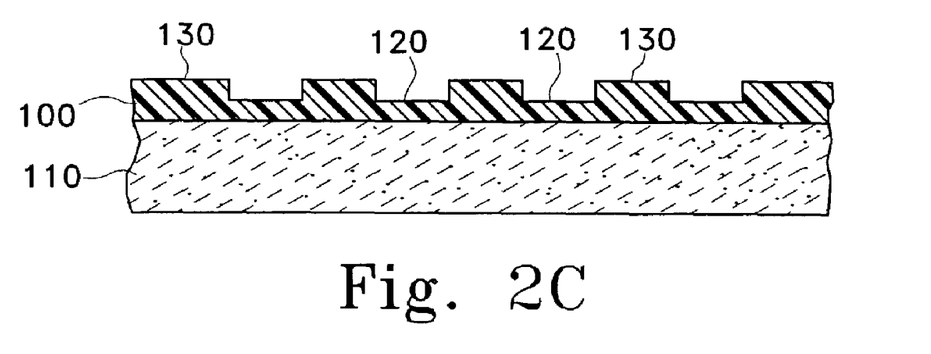
Figure 2D:
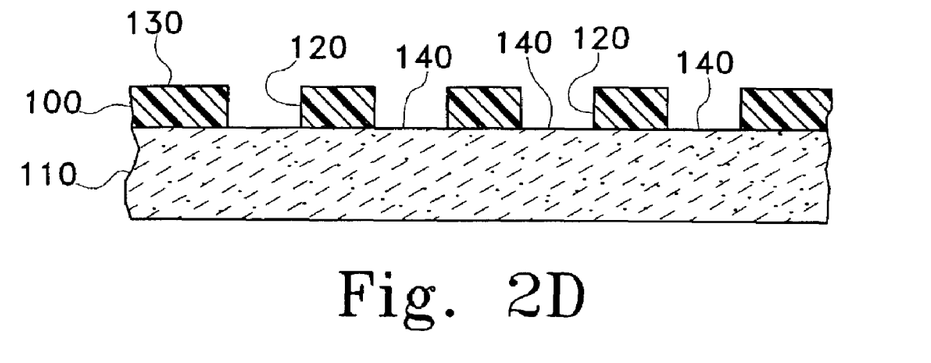

As shown in FIGS. 2B and 2C, the mold creates patterned masking regions 130 punctuated by depressions 120 in the thin masking layer 100 overlying the underlying layer 110. In FIG. 2B, the depressions 120 formed by the nanoimprinting technique uncover exposed regions 140 of the underlying layer 110. Alternatively, as shown in FIGS. 2C and 2D, compressed regions, which do not contact the underlying layer, are formed in the masking material that generally conform to the pattern of the mold. The underlying layer is exposed subsequently by directional etching through the remaining thickness of the imprinted masking material by an etching process such as reactive-ion etching (RIE).

In one version of the invention, the exposed regions 140 of underlying material 110 in the depression 120 can be the catalyst. In an alternative version, the exposed underlying material 110 can be a non-catalytic material on which the catalyst can be deposited selectively without any deposition on the surrounding region. Such selective deposition can be accomplished by, for example, chemical vapor deposition or liquid-phase deposition.

Figure 3A:
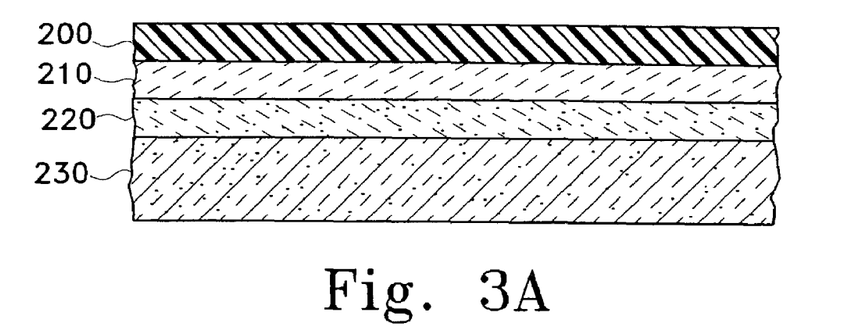
FIGS. 3A-3D show steps for exposing a catalytic layer below a noncatalytic layer after imprinting in accordance with an embodiment of the present invention.

FIGS. 3A-3D show steps for exposing a catalytic layer below a noncatalytic layer after imprinting in accordance with another version of the present invention. As shown in FIG. 3A, the following multi-layered structure is prepared before imprinting: (1) a catalytic layer 220 is provided overlying a substrate 230; (2) a non-catalytic layer 210 is provided overlying the catalytic layer 220; and (3) a thin masking layer 200 is deposited on top of the underlying non-catalytic layer 210. Generally, the thin masking layer is composed of material resistant to etching procedures, such as a polymer material, whereas the material comprising the non-catalytic layer is susceptible to etching in suitably selected etchants. For example, a silicon oxide layer can be selectively etched in a wet etchant that contains hydrogen fluoride (HF) or by dry etching in a fluorocarbon gas.

Figure 3B:
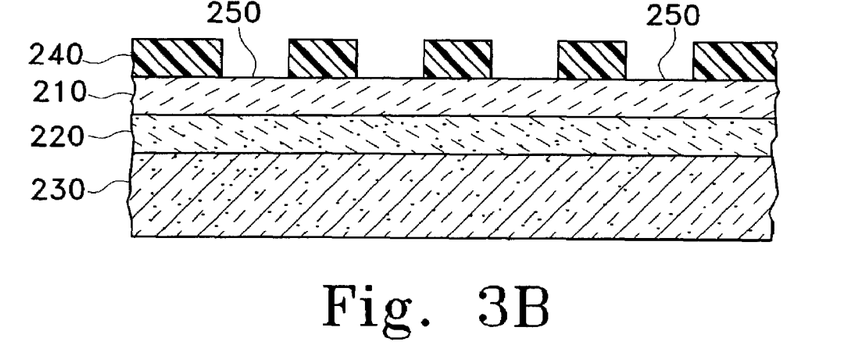
Figure 3C:
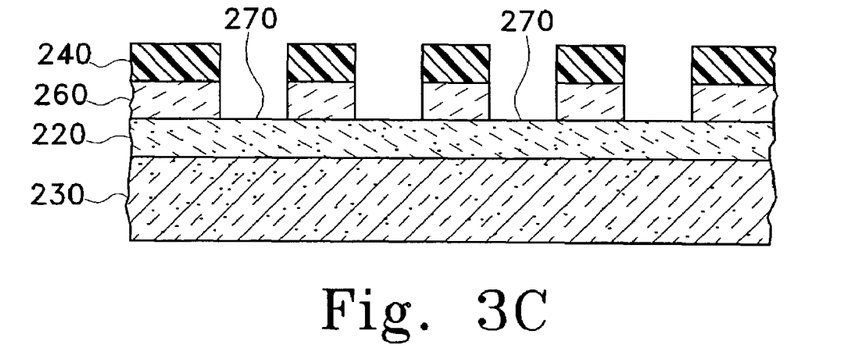
Figure 3D:
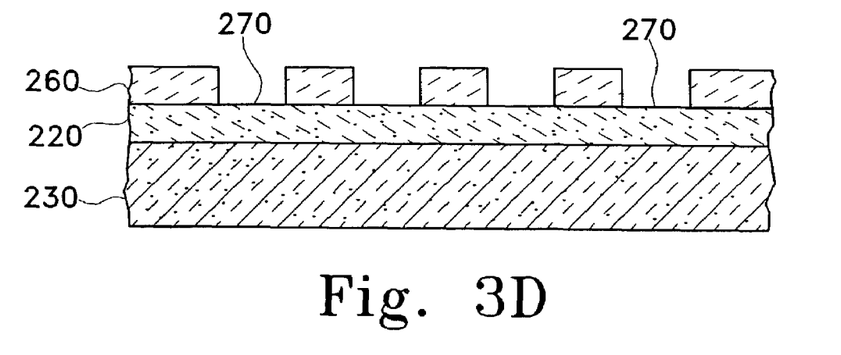

As shown in FIG. 3B, the mold creates a patterned masking layer 240 punctuated by depressions uncovering exposed regions 250 of non-catalytic layer 210. As shown in FIG. 3C, the exposed regions of the non-catalytic layer are then subjected to an etching step to form an etched non-catalytic layer 260 punctuated by exposed catalytic regions 270. Preferably, the etching step is conducted using a directional etching process, such as reactive-ion etching (RIE), to avert undercutting portions of the non-catalytic layer protected by the patterned masking layer 240. As shown in FIG. 3D, the masking material can be removed by, for example, selectively dissolving the masking material in a solvent, thereby uncovering the top surface of the etched non-catalytic layer.

Figure 4A:
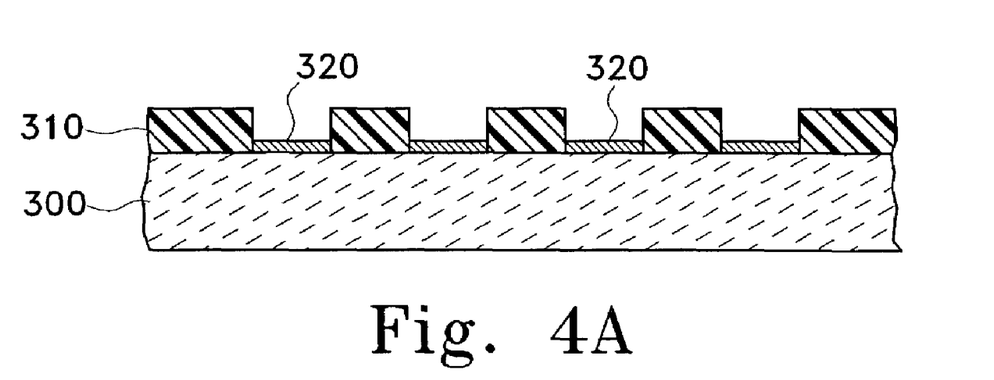
FIGS. 4A-4B shows steps for selectively adding catalyst to an exposed surface in accordance with an embodiment of the present invention.
Figure 4B:
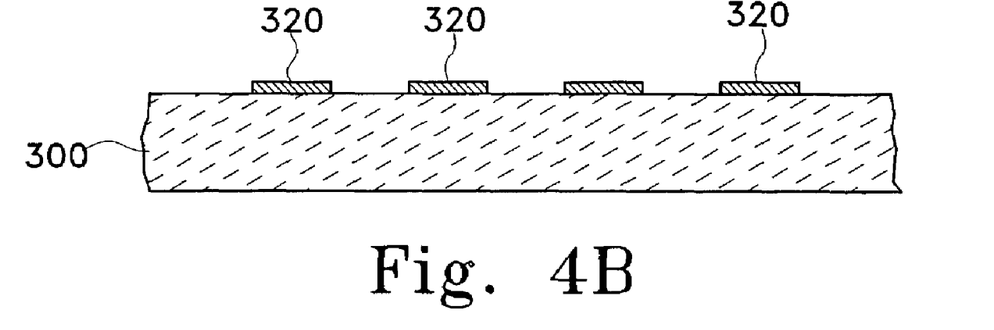

FIGS. 4A-4B shows steps for selectively adding catalyst to an exposed surface in accordance with some versions of the present invention. More particularly, some versions of the preceding procedures produce a patterned masking layer 310 punctuated by regions exposing a surface of an underlying layer 300. As shown in FIG. 4A, when the underlaying layer does not contain a catalyst, an array of regularly spaced catalyst nanoislands 320 can be generated by selectively depositing catalytic material on the exposed surfaces of the underlaying layer 300 interposed throughout the patterned masking layer. As shown in FIG. 4B, the patterned masking layer can then be removed to uncover the underlying layer, dotted with slightly elevated catalyst nanoislands.

In any case, an array of discrete nanoscale regions of catalytic material are formed at the locations determined by the pattern on the mold, and nanowires are then grown by catalytic decomposition of a silicon-containing gas such as silane ($SiH_4$) or dichlorosilane ($SiH_2Cl_2$).

Figures 5A, 5B:
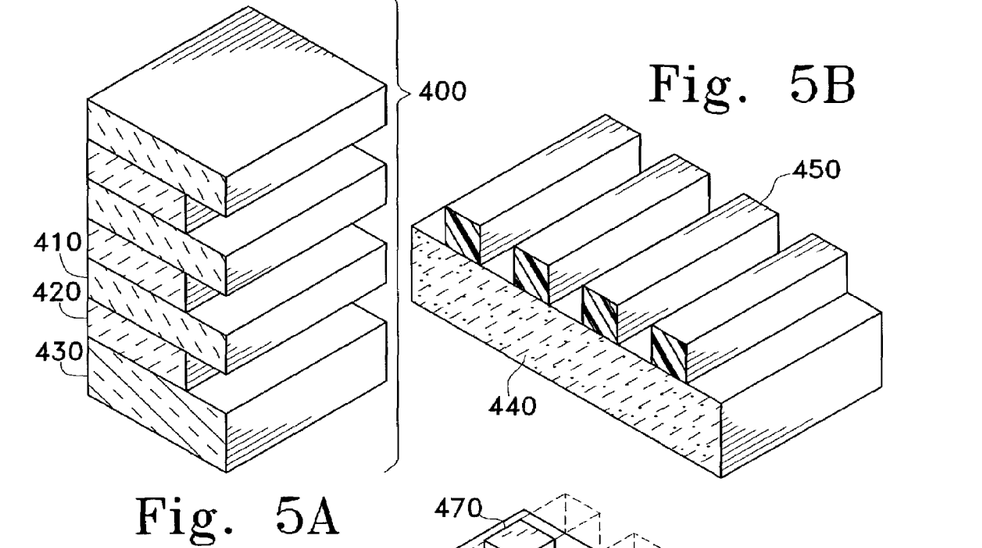
FIG. 5A-5D show steps to make and use a superlattice mold for nanoimprinting one or more sets of lines in accordance with an embodiment of the present invention.

FIG. 5A-5D show steps to make a regular array of uniformly spaced nanoparticles using a nanoimprinting device in accordance with another version of the present invention. A nanoimprinting device can be provided using previously described techniques [U.S. Pat. Nos. 6,294,450, 6,365,059, and 6,407,443; and U.S. Patent Application Number 2001/0044300, incorporated herein by reference]. As shown in FIG. 5A, a mold 400 is constructed by growing or depositing a plurality of alternating layers of two dissimilar materials, comprising a layer of first material 410 and a layer of second material 420, on a mold substrate 430. The alternating layers form a stack, with the thickness of each layer determined by the required nanoparticle dimension and spacing. Typical dimensions and spaces are 5 nm to 100 nm. The stack will have a major surface parallel to that of the substrate 430. The stack is cleaved and/or polished normal to its major surface to expose the plurality of alternating layers. The exposed layers are then etched to a chosen depth using an etchant that etches the first material 410 at a different rate than the second material 420, thereby creating a pattern of recessed strips on the edge of the stacked structure 400.

As shown in FIG. 5B, the edge structure can then be used to form nanoimprinted lines 450 in a layer of masking material overlying a layer of catalyst 440. The material not protected by the pattern can be etched at this time, creating nanoimprinted lines, as described previously (supra).

Figures 5C, 5D:
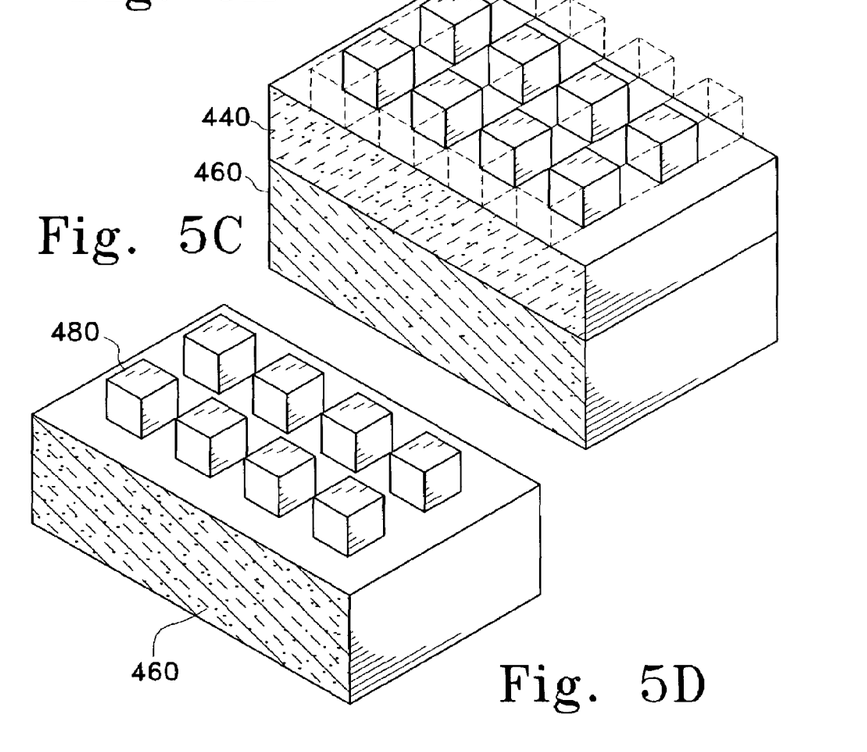

FIG. 5C shows the results of further processing in accordance with one version of the present invention. After the first set of lines 450 is formed, as in FIG. 5B, the mold 400 is rotated and then applied to the structure again, creating a second set of lines in the masking material Both patterns can be defined in the masking material before etching the underlying device material, or the device material can be etched after each nanoimprinting step. FIG. 5C also shows the device material and the masking material established on a substrate 460.

The two sets of intersecting lines can be orthogonal, creating a rectangular array of square masking elements 470, as in FIG. 5C or they can be purposely oriented at a non-perpendicular angle, creating a skewed array of parallelograms. Moreover, the mold can be rotated and applied again to create polygonal shaped masking elements.

As shown in FIG. 5D, catalyst nanoislands 480 can be created by etching exposed regions of the catalyst and removing the protective masking elements. Alternatively, if non-catalytic materials are initially used, the nanoislands can be treated to create catalyst islands. For example, the catalyst can be added chemically by selective addition to the islands formed in FIGS. 5C and 5D, or physically using the different elevations of the islands and the background regions. These catalyst nanoislands can then be used as catalysts for nanowire growth.

Figures 6A, 6B, 6C:
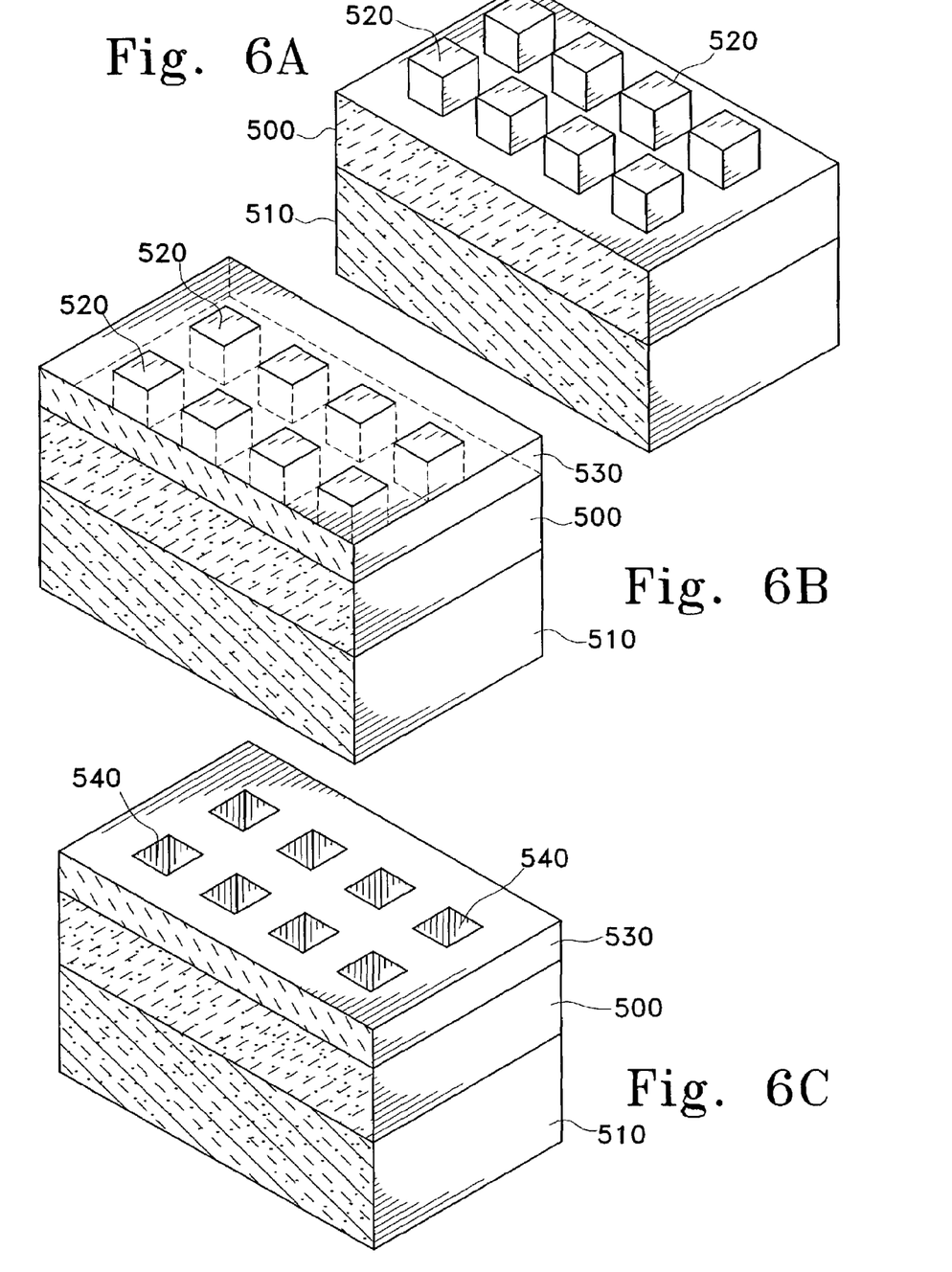
FIG. 6A-6C show steps for exposing catalyst regions surrounded by a noncatalytic layer in accordance with an embodiment of the present invention.

FIGS. 6A-6D. show another version of a method for exposing catalyst regions surrounded by a noncatalytic layer. As shown in FIGS. 6A and 6B, a layer of the catalytically active material 500 is formed on a substrate 510, and a layer that is not catalytically active 530 is formed over the catalytically active layer 500. FIG. 6A shows that before forming the non-catalytic layer 530, the method described above, i.e., of imprinting a first set of lines, then rotating and reapplying the mold to create a regular array of polygons in the masking material, is used to form a mask 520 over the desired catalytically active regions. Another alternative (not shown) would include a harder masking material underlying a top masking layer, which is made of material suitably soft for nanoimprinting. The pattern would be transferred to the underlying layer of hard masking material by etching. FIG. 6B shows the surrounding areas being covered by the noncatalytically active material 530, which is not deposited on (or removed by, e.g., chemical-mechanical polishing from) the protected regions of the catalyst. As shown in FIG. 6C, the masking material is then removed, leaving nanometer size exposed regions of the catalytically active material 540 surrounded by material that is not catalytically active.

The previously described versions of the present invention have many advantages. In particular, the methods of the present invention are capable of forming smaller catalyst islands than are possible with conventional lithography or even with electron-beam lithography. The present methods can also form catalyst islands more rapidly and less expensively than electron-beam lithography because nanoimprinting is a parallel process (forming many patterns at the same time), rather than a serial process (forming patterns sequentially) like electron-beam lithography.

Although the present invention has been described in considerable detail with reference to certain preferred versions thereof, other versions are possible. For example, the technique described above, of rotating a nanoscale mold having a pattern of recessed strips, can also be used to form an intermediate mold having a regular array of polygonal protrusions. The entire pattern of small nanoislands can then be formed in or on an underlying material in one impression. Alternatively, pattern definition and lift-off techniques can be used, in which a nanoscale pattern is formed in an underlying material and later removed along with any material deposited on top of the pattern. Therefore, the spirit and scope of the appended claims should not be limited to the description of the preferred versions contained herein.

What is claimed is:

1. A method of forming a patterned array of nanoscale, catalytic regions, the patterned array comprising rows and columns of the catalytic regions in two dimensions, comprising:
   a) providing a substrate;
   b) providing a mold with nanoscale protrusions forming a desired pattern;
   c) transferring the pattern of the mold to a surface of the substrate, either (1) by adding catalytic material on the protrusions, or (2) by removing material from the surface of the substrate to expose portions of an underlying nanowire growth enabling catalytic layer, or (3) by removing portions of a nanowire growth enabling catalytic layer on the surface of the substrate to expose portions of an underlying non-catalytic layer and leave islands of the nanowire growth enabling catalytic layer, or (4) by covering portions of a nanowire growth enabling catalytic layer on the surface of the substrate with a non-catalytic material so as to leave islands of the nanowire growth enabling catalytic layer, or (5) by forming depressions in the surface of the substrate and depositing nanowire growth enabling catalytic material in the depressions, thereby creating the patterned array of nanoscale catalytic regions;
   wherein the mold is provided with a patterned array of recessed strips, each recessed strip positioned between two nanoscale protrusions, for imprinting in a first step an array of lines, and for imprinting in a second step, by rotation of the mold relative to the substrate, a second set of lines intersecting the array of lines, thereby forming the patterned array.

2. The method of claim 1 for forming an array of nanoscale catalytic nanoparticles on the substrate comprising:
   i) providing the mold with nanoscale protrusions forming the desired pattern;
   ii) coating the protrusions with the catalytic material; and
   iii) transferring the desired pattern of the catalytic material to the surface of the substrate by contacting the catalytic material with the substrate.

3. The method of claim 2 wherein the mold is fabricated by fine lithography.

4. The method of claim 3 wherein the fine lithography is electron beam lithography.

5. The method of claim 1, further comprising the step of growing silicon nanowires from the catalytic regions by decomposition of silicon-containing gas.

6. The method of claim 1 for forming an array of nanowire growth enabling catalyst nanoparticles, comprising:
   i) depositing a layer of masking material on an underlying layer;
   ii) providing the mold with nanoscale protrusions forming the desired pattern;
   iii) pressing the protusions of the mold into the masking material so that depressions are formed in the masking layer in the desired pattern;
   iv) exposing the underlying layer in the depressions; and
   v) localizing nanowire growth enabling catalytic material in the depressions.

7. The method of claim 6 wherein the underlying substrate contains the nanowire growth enabling catalytic material.

8. The method of claim 6 wherein the nanowire growth enabling catalytic material is selectively deposited in the depressions.

9. The method of claim 6, further comprising the step of growing silicon nanowires from the nanowire growth enabling catalytic material by decomposition of silicon-containing gas.

10. The method of claim 6 wherein the mold is fabricated by fine lithography.

11. The method of claim 10 wherein the fine lithography is electron beam lithography.

12. The method of claim 1 for forming an array of nanowire growth enabling catalytic material circumscribed by non-catalytic material, comprising:
   i) obtaining the substrate;
   ii) providing the nanowire growth enabling catalytic layer on the substrate;
   iii) forming the non-catalytic layer over the nanowire growth enabling catalytic layer;
   iv) depositing a layer of masking material on the non-catalytic layer;
   v) providing the mold with nanoscale protrusions forming the desired pattern;
   vi) pressing the protrusions of the mold into the masking material so that depressions are formed in the masking layer in the desired pattern;
   vii) exposing nanoscale regions of the non-catalytic layer in the depressions;
   viii) etching the exposed non-catalytic region to expose nanoscale regions of the nanowire growth enabling catalytic layer; and
   ix) removing the masking material.

13. The method of claim 1 for forming a regular array of uniformly spaced nanowire growth enabling nanoparticles, comprising:
   i) providing a plurality of alternating layers of a first material and a second material forming a stack of parallel layers, wherein the first material is dissimilar from the second material, each layer having a nanoscale thickness;
   ii) creating an edge of the stack normal to the parallel layers, wherein each layer of the first and second materials is exposed;
   iii) generating the mold having a pattern of alternating recessed and protruding lines by etching the edge of the stack in an etchant that attacks the first material at a different rate than the second material, thereby creating said pattern on the edge of the stack;
   iv) providing the nanowire growth enabling catalytic layer overlying the substrate, said nanowire growth enabling catalytic layer being coated with a masking material layer; and
   v) forming a first set of nanoimprinted lines in the masking material layer, by pressing the protruding lines of the mold into the masking material layer so that strips of the nanowire growth enabling catalytic layer are exposed.

14. The method of claim 13 wherein the edge of the stack is created by cleaving or polishing the stack normal to the parallel layers.

15. The method of claim 13, further comprising the step of etching the exposed strips of the nanowire growth enabling catalytic layer to form lines of nanowire growth enabling catalyst having a nanoscale width.

16. The method of claim 13, further comprising the steps of:
   i) rotating the mold; and
   ii) applying the rotated mold to the masking material thereby forming a second set of nanoimprinted lines intersecting the first set of lines so that a regular array of polygons is formed in the masking material.

17. The method of claim 16, further comprising the step of etching the nanowire growth enabling catalytic material that is not protected by the array of polygons in the masking material to form nanowire growth enabling catalytic nanoislands.

18. The method of claim 17 wherein the masking material layer is subsequently removed.

19. The method of claim 16 wherein the two sets of lines are orthogonal, thereby creating a rectangular array of squares.

20. The method of claim 16 wherein the first and second sets of lines are oriented at a non-perpendicular angle, thereby creating a skewed array of parallelograms.

21. The method of claim 1 for exposing nanoscale regions of nanowire growth enabling catalytic material surrounded by a non-catalytic layer, comprising:
   i) providing a multilayered composite, comprising:
      a) a substrate;
      b) a layer of nanowire growth enabling catalytic material covering the substrate; and
      c) a masking layer formed over the nanowire growth enabling catalytic layer;
   ii) imprinting a first set of lines in the masking layer using the mold having a patterned edge of alternating recessed and protruding strips, said strips having a lateral dimension in the nanoscale range;
   iii) rotating and reapplying the mold to form polygons of masking material in a regular array;
   iv) covering the nanowire growth enabling catalytic material that is not protected by the masking material with the non-catalytic material; and
   v) removing the masking material to expose nanoscale regions of the nanowire growth enabling catalytic material circumscribed by non-catalytic material.

22. The method of claim 21 wherein the masking layer includes a top layer of masking material suitably soft for imprinting and an underlying layer of masking material which is harder than the top layer.

23. The method of claim 22 wherein the regular array of polygons is transferred to the underlying layer of masking material by etching.

24. The method of claim 21 wherein the exposed regions of nanowire growth enabling catalytic material are used as catalysts for nanowire growth.

25. The method of claim 1 wherein the patterned array of nanoscale catalytic regions comprises a patterned array of catalyst nanoparticles or of nanowire growth enabling catalyst nanoparticles.

26. The method of claim 1 wherein the mold is provided with a patterned array of protrusions to form the patterned array.

27. The method of claim 1 wherein the array of lines and the second set of lines are orthogonal, thereby creating a rectangular array of squares.

28. A method of forming a patterned array of nanoscale, catalytic regions, the patterned array comprising rows and columns of the catalytic regions in two dimensions, comprising:
   a) providing a substrate;
   b) providing a mold with nanoscale protrusions forming a desired pattern;
   c) transferring the pattern of the mold to a surface of the substrate, either (1) by adding catalytic material on the protrusions, or (2) by covering portions of a nanowire growth enabling catalytic layer on the surface of the substrate with a non-catalytic material so as to leave islands of the nanowire growth enabling catalytic layer, or (3) by forming depressions in the surface of the substrate and depositing nanowire growth enabling catalytic material in the depressions, thereby creating the patterned array of nanoscale catalytic regions;
   wherein the mold is provided with a patterned array of recessed strips, each recessed strip positioned between two nanoscale protrusions, for imprinting in a first step an array of lines, and for imprinting in a second step, by rotation of the mold relative to the substrate, a second set of lines intersecting the array of lines, thereby forming the patterned array.

* * * * *

UNITED STATES PATENT AND TRADEMARK OFFICE
CERTIFICATE OF CORRECTION

| | | |
|---|---|---|
| PATENT NO. | : 7,378,347 B2 | Page 1 of 1 |
| APPLICATION NO. | : 10/281678 | |
| DATED | : May 27, 2008 | |
| INVENTOR(S) | : Theodore I. Kamins et al. | |

It is certified that error appears in the above-identified patent and that said Letters Patent is hereby corrected as shown below:

In column 7, line 53, in Claim 6, delete "an underlying" and insert -- the underlying --, therefor.

Signed and Sealed this

Fourteenth Day of July, 2009

JOHN DOLL
*Acting Director of the United States Patent and Trademark Office*